United States Patent
Gebeyehu et al.

(10) Patent No.: US 9,817,416 B2
(45) Date of Patent: Nov. 14, 2017

(54) APPARATUS AND METHODS FOR PROGRAMMABLE LOW DROPOUT REGULATORS FOR RADIO FREQUENCY ELECTRONICS

(71) Applicant: SKYWORKS SOLUTIONS, INC., Woburn, MA (US)

(72) Inventors: Netsanet Gebeyehu, San Jose, CA (US); Ying Shi, Saratoga, CA (US); Jinghang Feng, Santa Clara, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/219,915

(22) Filed: Jul. 26, 2016

(65) Prior Publication Data
US 2017/0052553 A1    Feb. 23, 2017

Related U.S. Application Data

(60) Provisional application No. 62/206,120, filed on Aug. 17, 2015.

(51) Int. Cl.
G05F 1/56 (2006.01)
G05F 1/575 (2006.01)

(52) U.S. Cl.
CPC .................... *G05F 1/575* (2013.01)

(58) Field of Classification Search
CPC .................... G05F 1/56; G05F 1/575
USPC .......................... 323/280–289, 315
See application file for complete search history.

(56) References Cited

U.S. PATENT DOCUMENTS

| | | |
|---|---|---|
| 7,038,434 B1 | 5/2006 | Brekelmans et al. |
| 8,344,806 B1 | 1/2013 | Franck et al. |
| 2007/0046271 A1* | 3/2007 | Zolfaghari .............. G05F 1/575 323/274 |
| 2010/0075724 A1 | 3/2010 | Sivadas |
| 2014/0084881 A1 | 3/2014 | Shih et al. |
| 2014/0266103 A1 | 9/2014 | Wang et al. |
| 2016/0202714 A1 | 7/2016 | Luria et al. |
| 2016/0231761 A1 | 8/2016 | Jain et al. |

* cited by examiner

*Primary Examiner* — Adolf Berhane
*Assistant Examiner* — Nusrat Quddus
(74) *Attorney, Agent, or Firm* — Knobbe Martens Olson & Bear LLP

(57) ABSTRACT

Apparatus and methods for programmable low dropout (LDO) regulators for radio frequency (RF) electronics are provided herein. In certain configurations, an LDO regulator for generating a programmable output voltage includes a regulation field-effect transistor (FET) having a drain electrically connected to the LDO regulator's output, an error amplifier that controls a gate of the regulation FET, a feedback circuit that provides a feedback signal to an inverting input of the error amplifier, an output capacitor electrically connected to the LDO regulator's output, and an alternative discharge circuit. When the output voltage of the LDO regulator is programmed from a high voltage level to a low voltage level, the alternative discharge circuit activates to discharge the output capacitor to improve the LDO regulator's transient response.

21 Claims, 10 Drawing Sheets

APPARATUS AND METHODS FOR PROGRAMMABLE LOW DROPOUT REGULATORS FOR RADIO FREQUENCY ELECTRONICS

CROSS-REFERENCE TO RELATED APPLICATIONS

This application claims the benefit of priority under 35 U.S.C. §119(e) of U.S. Provisional Patent Application No. 62/206,120, filed Aug. 17, 2015 and titled "APPARATUS AND METHODS FOR PROGRAMMABLE LOW DROPOUT REGULATORS FOR RADIO FREQUENCY ELECTRONICS," which is herein incorporated by reference in its entirety.

BACKGROUND

Field

Embodiments of the invention relate to electronic systems, and in particular, to programmable low dropout regulators for radio frequency (RF) electronics.

Description of the Related Technology

Power amplifiers can be included in mobile devices to amplify RF signals for transmission via antennas. It can be important to manage the power of RF signal transmissions to prolong battery life and/or provide a suitable transmit power level.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking, in which a supply voltage of the power amplifier is controlled in relation to the envelope of the RF signal. Thus, when a voltage level of the envelope of the RF signal increases the voltage level of the power amplifier supply voltage can be increased. Likewise, when the voltage level of the envelope of the RF signal decreases the voltage level of the power amplifier supply voltage can be decreased to reduce power consumption.

SUMMARY

In certain embodiments, the present disclosure relates to a programmable low dropout regulator. The programmable low dropout regulator includes an error amplifier, a regulation field-effect transistor, a feedback circuit, an output capacitor, and an alternative discharge circuit. The error amplifier includes an output and a first input. The regulation field-effect transistor includes a gate electrically connected to the output of the error amplifier and a drain electrically connected to an output node configured to provide an output voltage that is programmable. The feedback circuit is electrically connected between the output node and a first voltage, and is configured to provide a feedback signal to the first input of the error amplifier. The output capacitor is electrically connected to the output node, and the alternative discharge circuit is configured to discharge the output capacitor in response to programming the output voltage from a high voltage level to a low voltage level.

In some embodiments, the alternative discharge circuit includes a comparator configured to compare the output voltage to a trigger voltage, and to selectively activate an electrical path from the output node to the first voltage based on the comparison. In a number of embodiments, the alternative discharge circuit further includes a discharge field-effect transistor including a source electrically connected to the first voltage and a gate electrically connected to an output of the comparator. In various embodiments, the alternative discharge circuit further includes a discharge control circuit electrically connected between the output node and the drain of the regulation field-effect transistor. According to some embodiments, the alternative discharge circuit further includes a trigger voltage generation circuit configured to generate the trigger voltage, and the trigger voltage generation circuit includes one or more resistors and a current source that provides a current that flows through the one or more resistors to generate the trigger voltage. In accordance with several embodiments, the low dropout regulator is configured to receive a control signal operable to control a voltage level of the output voltage, and the alternative discharge circuit is configured to adjust a voltage level of the trigger voltage based on the control signal.

According to various embodiments, the feedback circuit includes a first resistor and a second resistor electrically connected in series between the output node and the first voltage, and the first resistor has a programmable resistance operable to change a voltage level of the output voltage.

In a number of embodiments, the programmable low dropout regulator further includes a reference voltage generator configured to provide a reference voltage to a second input of the error amplifier.

In certain embodiments, the present disclosure relates to a power amplifier system. The power amplifier system includes a multi-stage power amplifier including a driver stage, and a programmable low dropout regulator including an output that powers the driver stage with an output voltage that is programmable. The programmable low dropout regulator includes an error amplifier, a regulation field-effect transistor including a gate electrically connected to an output of the error amplifier and a drain electrically connected to the output of the programmable low dropout regulator, a feedback circuit configured to provide feedback to a first input of the error amplifier based on a voltage level of the output voltage, an output capacitor electrically connected to the output of the programmable low dropout regulator, and an alternative discharge circuit configured to discharge the output capacitor in response to programming the output voltage from a high voltage level to a low voltage level.

In some embodiments, the power amplifier system further includes a transceiver configured to generate a control signal operable to control the voltage level of the output voltage. According to several embodiments, the programmable low dropout regulator further includes a reference voltage generator configured to generate a reference voltage for a second input of the error amplifier, and the reference voltage generator is configured to receive the control signal. In various embodiments, the feedback circuit includes a resistor having a programmable resistance controlled by the control signal.

In accordance with a number of embodiments, the alternative discharge circuit includes a comparator configured to compare the output voltage to a trigger voltage, and to selectively activate an electrical path from the output of the programmable low dropout regulator to a first voltage based on the comparison. In various embodiments, the electrical path includes a discharge control circuit and a discharge field-effect transistor electrically connected in series between the output of the programmable low dropout regulator and the first voltage.

In some embodiments, the multi-stage power amplifier further includes an output stage, and the power amplifier system further includes a DC-to-DC converter that powers the output stage.

In various embodiments, the multi-stage power amplifier further includes an output stage, and the power amplifier system further includes an envelope tracker that powers the output stage.

In certain embodiments, the present disclosure relates to a method of voltage regulation in a programmable low dropout regulator. The method includes controlling a gate of a regulation field-effect transistor using an error amplifier, regulating an output voltage provided at an output node using the regulation field-effect transistor, generating a feedback signal for a first input of the error amplifier based on a voltage level of the output voltage using a feedback circuit, stabilizing the output voltage using an output capacitor, and discharging the output capacitor using an alternative discharge circuit in response to programming the output voltage from a high voltage level to a low voltage level.

In some embodiments, the method further includes powering a driver stage of a power amplifier using the output voltage.

In various embodiments, the method further includes comparing the output voltage of the low dropout regulator to a trigger voltage, and selectively activating an electrical path from the output node to a first voltage through the alternative discharge circuit based on the comparison. According to several embodiments, the method further includes programming the voltage level of the output voltage using a control signal, and adjusting a voltage level of the trigger voltage based on the control signal.

DETAILED DESCRIPTION OF EMBODIMENTS

Figure 1:
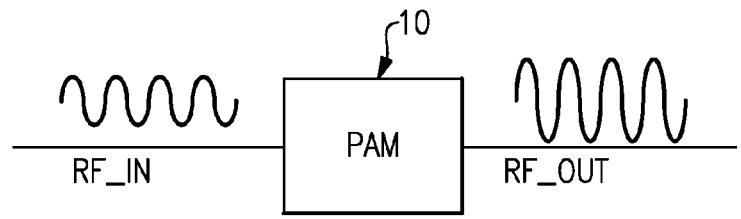
FIG. 1 is a schematic diagram of a power amplifier module for amplifying a radio frequency (RF) signal.

The headings provided herein, if any, are for convenience only and do not necessarily affect the scope or meaning of the claimed invention.

A power management system can be used to generate a supply voltage that has a programmable voltage level. For example, a power management system can be used to generate a programmable supply voltage for a power amplifier. Additionally, the voltage level of the power amplifier supply voltage can be changed over time to improve the power amplifier's power added efficiency (PAE).

A transient response of the power management system can be important. For example, in wireless device applications, a supply voltage generated by a power management system may be specified to settle to a programmed voltage level in less than a certain amount of time, for instance, about 5 μs.

A programmable low dropout (LDO) regulator can be used to generate a power amplifier supply voltage for one or more stages of a power amplifier, such as an input or driver stage. In such configurations, it is desirable for the LDO regulator to have a low quiescent current to prolong the wireless device's battery life.

An LDO regulator can include an error amplifier, a reference voltage generator that generates a reference voltage for the error amplifier's non-inverting input, a regulation field-effect transistor (FET) having a gate controlled by the error amplifier's output and a drain that provides voltage regulation to the LDO regulator's output, an output capacitor electrically connected to the LDO regulator's output, and a feedback circuit that provides feedback from the LDO regulator's output to the error amplifier's inverting input. To achieve low quiescent current, the feedback circuit can be implemented with a relatively high resistance, for instance, 100 kΩ or more. To provide stability, the LDO regulator can also include a relatively large output capacitor, for instance, 0.1 μF or more.

When an LDO regulator is implemented with a relatively high resistance feedback circuit and a relatively large output capacitor, the LDO regulator can suffer from a large resistor-capacitor (RC) time constant associated with changing the programmable output voltage of the LDO regulator from a high voltage level to a low voltage level. For instance, the LDO regulator may have an RC time constant of 10 μs to 100 μs or more in such configurations. However, an LDO regulator with a large RC time constant may be unsuitable for radio frequency (RF) systems specified to operate using a programmable supply voltage that is specified to settle to a programmed voltage level relatively quickly.

The RC time constant of an LDO regulator may be further constrained by a need to maintain a stability of the LDO regulator's feedback loop over variation in temperature, process, supply voltage, and/or load conditions. For instance, a dominant pole of the LDO regulator's transfer function may change position in frequency with variation in load current, and thus a large output capacitor may be used to provide frequency compensation. Thus, the output capacitor may have a relatively large capacitance value to achieve loop stability.

Accordingly, an LDO regulator can suffer from a trade-off between low power consumption (associated with a large feedback resistance), robust stability (associated with a large output capacitance), and fast transient response (associated with small feedback resistance and small output capacitance).

Apparatus and methods for programmable LDO regulators for RF electronics are provided herein. In certain configurations, an LDO regulator for generating a programmable output voltage includes a regulation FET having a drain electrically connected to the LDO regulator's output, an error amplifier that controls a gate of the regulation FET, a feedback circuit that provides a feedback signal to an inverting input of the error amplifier, an output capacitor electrically connected to the LDO regulator's output, and an alternative discharge circuit. When the output voltage of the LDO regulator is programmed from a high voltage level to a low voltage level, the alternative discharge circuit activates to discharge the output capacitor to improve the LDO regulator's transient response.

By configuring the LDO regulator in this manner, the LDO regulator can have a transient response from high output voltage to low output voltage that is not constrained by an RC time constant associated with a resistance of the feedback circuit and a capacitance of the output capacitor. Thus, the LDO regulator achieves rapid output voltage transition when being programmed from a high output voltage level to a low output voltage level, while maintaining the benefits of robust stability and low quiescent current. The LDO regulator also achieves rapid output voltage transition when being programmed from a low output voltage level to a high output voltage level, since the regulation FET can be used to charge the output capacitor for such a transition.

In certain configurations, the alternative discharge circuit includes a detection circuit such as a comparator that compares the LDO regulator's output voltage to a target voltage. In certain implementations, the target voltage is generated using a replica of a portion of the LDO regulator, such as a replica of all or part of the LDO regulator's feedback circuit. Additionally, the detection circuit can selectively activate the alternative discharge circuit to discharge the output capacitor when a voltage difference between the LDO regulator's output voltage and the target voltage is relatively large. However, when the voltage difference between the LDO regulator's output voltage and the target voltage is relatively small, the detection circuit can deactivate the alternative discharge circuit to inhibit the alternative discharge circuit from generating overshoot, undershoot and/or glitch in the LDO regulator's output voltage. Thus, the alternative discharge circuit can deactivate and provide a smooth hand-off of control of the output voltage to the LDO regulator's control loop.

FIG. 1 is a schematic diagram of a power amplifier module (PAM) 10 for amplifying an RF signal. The illustrated power amplifier module 10 amplifies an RF signal (RF_IN) to generate an amplified RF signal (RF_OUT). The power amplifier module 10 can include one or more LDO regulators implemented using one or more features of the present disclosure.

Figure 2:
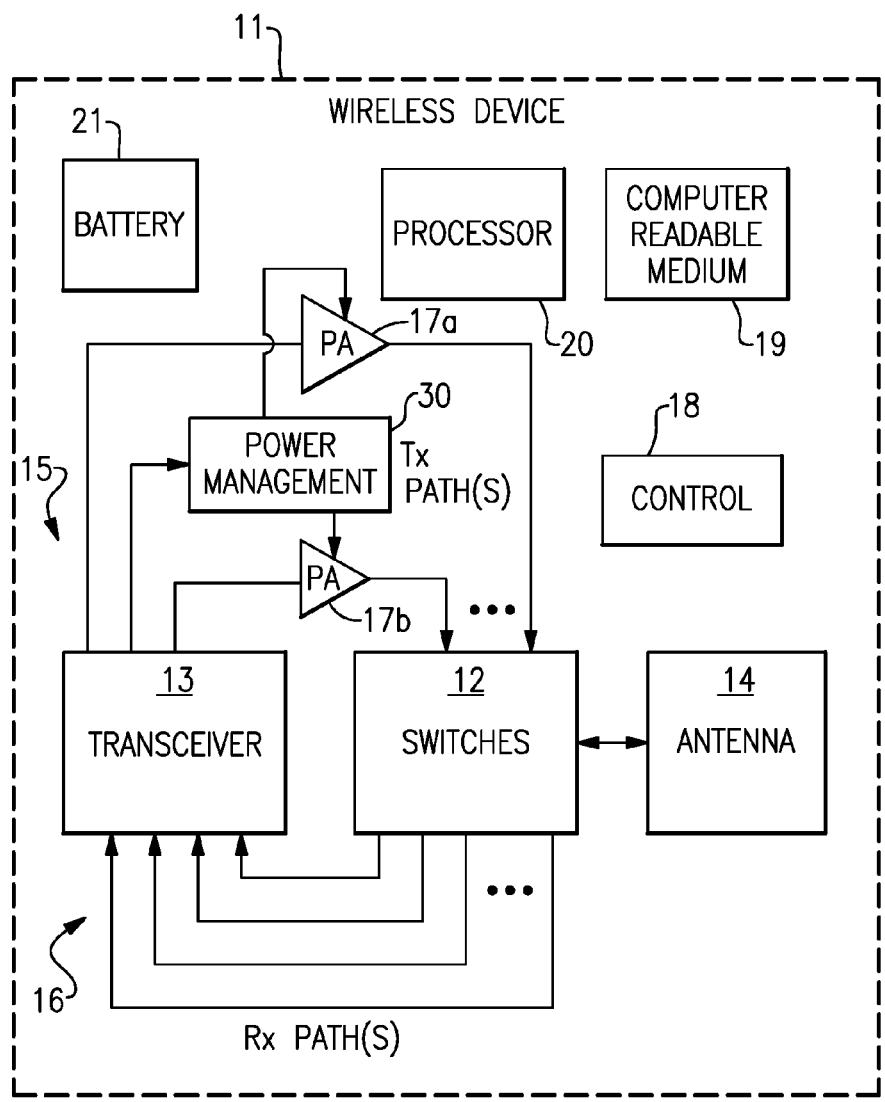
FIG. 2 is a schematic diagram of an example wireless device.

FIG. 2 is a schematic block diagram of an example wireless or mobile device 11. The wireless device 11 can include one or more LDO regulators implemented using one or more features of the present disclosure.

The example wireless device 11 depicted in FIG. 2 can represent a multi-band and/or multi-mode device such as a multi-band/multi-mode mobile phone. By way of examples, Global System for Mobile (GSM) communication standard is a mode of digital cellular communication that is utilized in many parts of the world. GSM mode mobile phones can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in mobile phone devices. In certain implementations, CDMA devices can operate in one or more of 800 MHz, 900 MHz, 1800 MHz and 1900 MHz bands, while certain W-CDMA and Long Term Evolution (LTE) devices can operate over, for example, 22 or more bands.

One or more features of the present disclosure can be implemented in the foregoing example modes and/or bands, and in other communication standards. For example, 802.11, 2G, 3G, 4G, LTE, and Advanced LTE are non-limiting examples of such standards. To increase data rates, the wireless device 11 can operate using complex modulated signals, such as 64 QAM signals.

In certain embodiments, the wireless device 11 can include switches 12, a transceiver 13, an antenna 14, power amplifiers 17a, 17b, a control component 18, a computer readable medium 19, a processor 20, a battery 21, and a power management system 30.

The transceiver 13 can generate RF signals for transmission via the antenna 14. Furthermore, the transceiver 13 can receive incoming RF signals from the antenna 14.

It will be understood that various functionalities associated with the transmission and receiving of RF signals can be achieved by one or more components that are collectively represented in FIG. 2 as the transceiver 13. For example, a single component can be configured to provide both transmitting and receiving functionalities. In another example, transmitting and receiving functionalities can be provided by separate components.

Similarly, it will be understood that various antenna functionalities associated with the transmission and receiving of RF signals can be achieved by one or more components that are collectively represented in FIG. 2 as the antenna 14. For example, a single antenna can be configured to provide both transmitting and receiving functionalities. In another example, transmitting and receiving functionalities can be provided by separate antennas. In yet another example, different bands associated with the wireless device 11 can operate using different antennas.

In FIG. 2, one or more output signals from the transceiver 13 are depicted as being provided to the antenna 14 via one or more transmission paths 15. In the example shown, different transmission paths 15 can represent output paths associated with different bands and/or different power outputs. For instance, the two example power amplifiers 17a, 17b shown can represent amplifications associated with different power output configurations (e.g., low power output and high power output), and/or amplifications associated with different bands. Although FIG. 2 illustrates a configuration using two transmission paths 15 and two power amplifiers 17a, 17b, the wireless device 11 can be adapted to include more or fewer transmission paths 15 and/or more or fewer power amplifiers.

In FIG. 2, one or more detected signals from the antenna 14 are depicted as being provided to the transceiver 13 via one or more receiving paths 16. In the example shown, different receiving paths 16 can represent paths associated with different bands. For example, the four example receiving paths 16 shown can represent quad-band capability that some wireless devices are provided with. Although FIG. 2 illustrates a configuration using four receiving paths 16, the wireless device 11 can be adapted to include more or fewer receiving paths 16.

To facilitate switching between receive and transmit paths, the switches 12 can be configured to electrically connect the antenna 14 to a selected transmit or receive path.

Thus, the switches 12 can provide a number of switching functionalities associated with operation of the wireless device 11. In certain embodiments, the switches 12 can include a number of switches configured to provide functionalities associated with, for example, switching between different bands, switching between different power modes, switching between transmission and receiving modes, or some combination thereof. The switches 12 can also be configured to provide additional functionality, including filtering and/or duplexing of signals.

FIG. 2 shows that in certain embodiments, a control component 18 can be provided for controlling various control functionalities associated with operations of the switches 12, the power amplifiers 17a, 17b, the power management system 30, and/or other operating components.

In certain embodiments, a processor 20 can be configured to facilitate implementation of various processes described herein. The processor 20 can implement various computer program instructions. The processor 20 can be a general purpose computer, special purpose computer, or other programmable data processing apparatus.

In certain embodiments, these computer program instructions may also be stored in a computer-readable memory 19 that can direct the processor 20 to operate in a particular manner, such that the instructions stored in the computer-readable memory 19.

The illustrated wireless device 11 also includes the power management system 30, which can be used to provide power amplifier supply voltages to one or more of the power amplifiers 17a, 17b. For example, the power management system 30 can be configured to change the supply voltages provided to the power amplifiers 17a, 17b to improve efficiency, such as power added efficiency (PAE). The power management system 30 can be used to provide average power tracking (APT) and/or envelope tracking (ET). Furthermore, as will be described in detail further below, the power management system 30 can include one or more LDO regulators used to generate power amplifier supply voltages for one or more stages of the power amplifiers 17a, 17b. In the illustrated implementation, the power management system 30 is controlled using a power control signal generated by the transceiver 13. In certain configurations, the power control signal is provided by the transceiver 13 to the power management system 30 over an interface, such as a serial peripheral interface (SPI) or Mobile Industry Processor Interface (MIPI).

In certain configurations, the wireless device 11 may operate using carrier aggregation. Carrier aggregation can be used for both Frequency Division Duplexing (FDD) and Time Division Duplexing (TDD), and may be used to aggregate a plurality of carriers or channels, for instance up to five carriers. Carrier aggregation includes contiguous aggregation, in which contiguous carriers within the same operating frequency band are aggregated. Carrier aggregation can also be non-contiguous, and can include carriers separated in frequency within a common band or in different bands.

Figure 3:
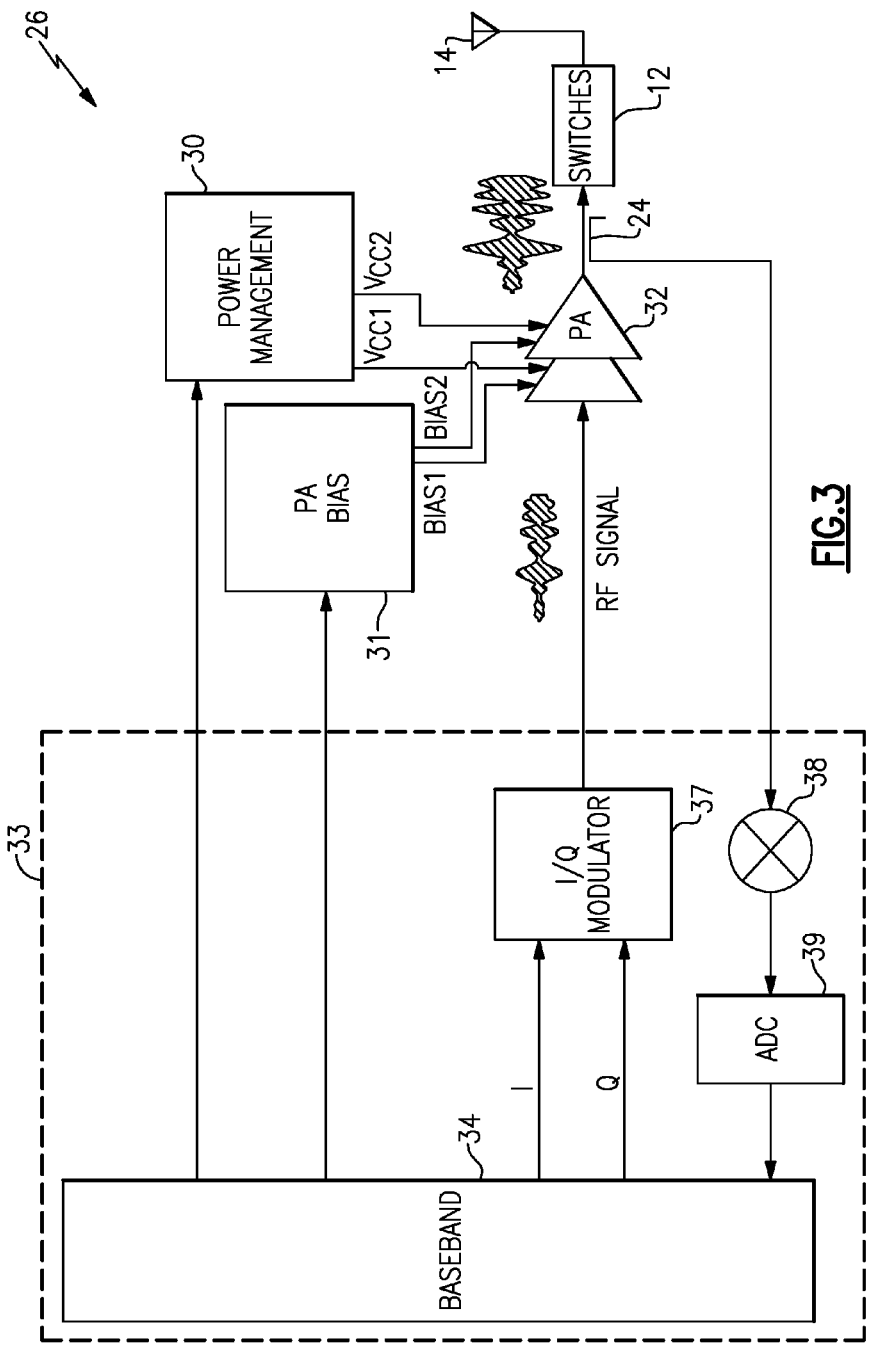
FIG. 3 is a schematic diagram of one embodiment of a power amplifier system.

FIG. 3 is a schematic block diagram of one example of a power amplifier system 26. The illustrated power amplifier system 26 includes the switches 12, the antenna 14, a directional coupler 24, a power management system 30, a power amplifier bias circuit 31, a power amplifier 32, and a transceiver 33. The illustrated transceiver 33 includes a baseband processor 34, an I/Q modulator 37, a mixer 38, and an analog-to-digital converter (ADC) 39. Although not illustrated in FIG. 3 for clarity, the transceiver 33 can include circuitry associated with receiving signals over one or more receive paths.

The baseband signal processor 34 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 37 in a digital format. The baseband processor 34 can be any suitable processor configured to process a baseband signal. For instance, the baseband processor 34 can include a digital signal processor, a microprocessor, a programmable core, or any combination thereof. Moreover, in some implementations, two or more baseband processors 34 can be included in the power amplifier system 26.

The I/Q modulator 37 can be configured to receive the I and Q signals from the baseband processor 34 and to process the I and Q signals to generate an RF signal. For example, the I/Q modulator 37 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 32. In certain implementations, the I/Q modulator 37 can include one or more filters configured to filter frequency content of signals processed therein.

The power amplifier bias circuit 31 receives a bias control signal from the transceiver 33, and generates one or more bias signals for the power amplifier 32. In the illustrated configuration, the power amplifier bias circuit 31 generates a first bias signal BIAS1 for biasing a driver stage of the power amplifier 32 and a second bias signal BIAS2 for biasing an output stage of the power amplifier 32. The bias signals BIAS1, BIAS2 can include current and/or voltage signals, and can be used, for example, to bias bases of bipolar transistors and/or gates of field-effect transistors associated with the power amplifier's stages. In certain configurations, the transceiver 33 can control the bias signals generated by the power amplifier bias circuit 31 to enhance the PAE of the power amplifier system 26. In one embodiment, the transceiver 33 controls each of the first and second bias signals BIAS1, BIAS2 to one of a multiple settings based on at least one of a frequency band of operation or a power mode (for example, high power mode, medium power mode, or low power mode).

The power amplifier 32 can receive the RF signal from the I/Q modulator 37 of the transceiver 33, and when enabled can provide an amplified RF signal to the antenna 14 via the switches 12. The directional coupler 24 can be positioned between the output of the power amplifier 32 and the input of the switches 12, thereby allowing an output power measurement of the power amplifier 32 that does not include insertion loss of the switches 12. However, other configurations of power measurement are possible.

In the illustrated configuration, the sensed output signal from the directional coupler 24 is provided to the mixer 38, which multiplies the sensed output signal by a reference signal of a controlled frequency. The mixer 38 operates to generate a downshifted signal by downshifting the sensed output signal's frequency content. The downshifted signal can be provided to the ADC 39, which can convert the downshifted signal to a digital format suitable for processing by the baseband processor 34. By including a feedback path between the output of the power amplifier 32 and the baseband processor 34, the baseband processor 34 can be configured to dynamically adjust the I and Q signals to optimize the operation of the power amplifier system 26. For example, configuring the power amplifier system 26 in this manner can aid in controlling the PAE and/or linearity of the power amplifier 32. However, other configurations of power control can be used.

The power management system 30 receives a power control signal from the transceiver 33, and generates one or more power amplifier supply voltages for the power amplifier 32. In the illustrated configuration, the power management system 30 generates a first power amplifier supply voltage $V_{CC1}$ for powering a driver stage of the power amplifier 32 and a second power amplifier supply voltage $V_{CC2}$ for powering an output stage of the power amplifier 32. In certain configurations, the transceiver 33 can control the voltage levels of the power amplifier supply voltages $V_{CC1}$, $V_{CC2}$ to enhance the power amplifier system's PAE.

The power management system 30 illustrates another example of an RF system that can include one or more LDO regulators implemented using one or more features of the present disclosure.

Figure 4A:
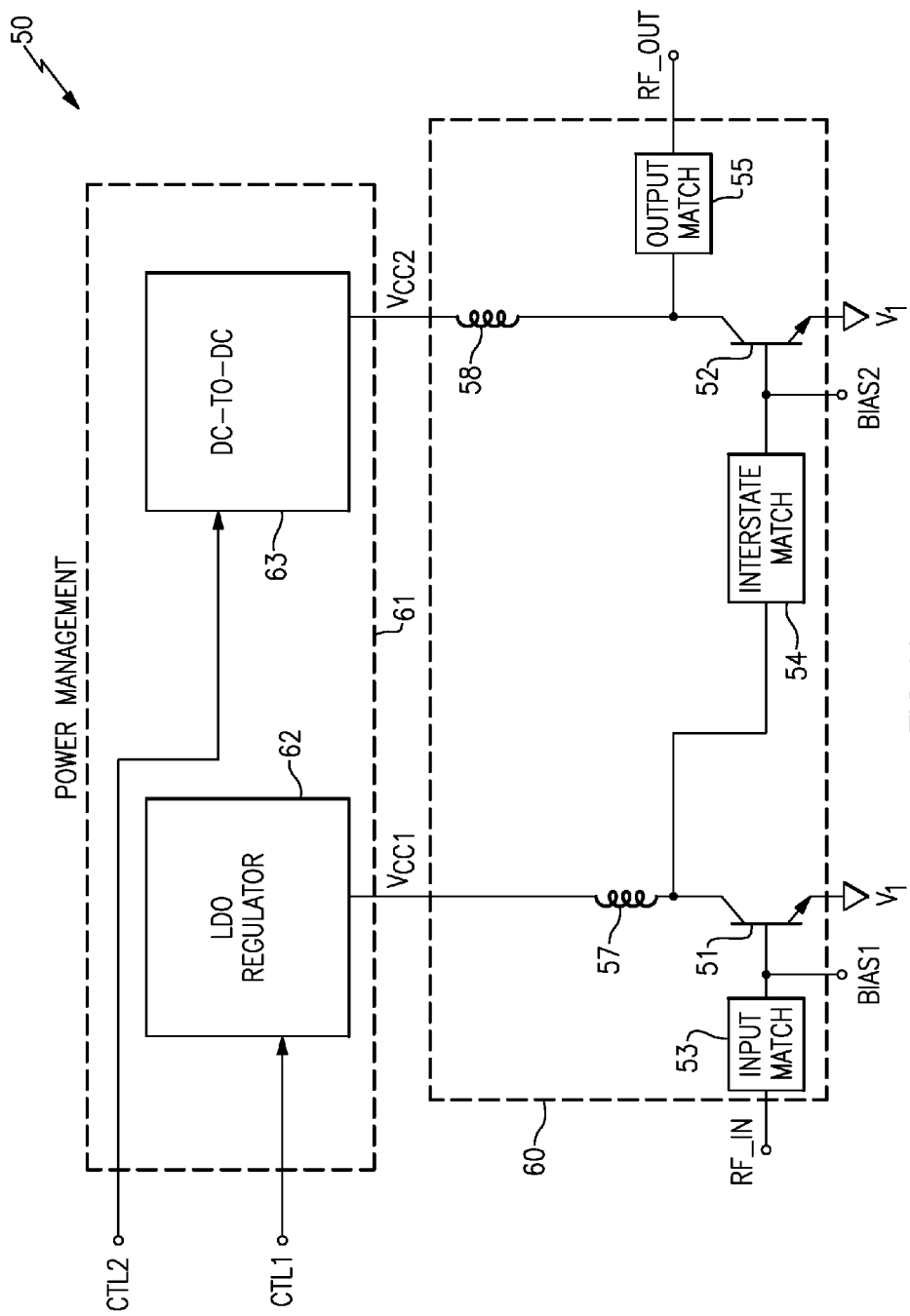
FIG. 4A is a schematic diagram of another embodiment of a power amplifier system.

FIG. 4A is a schematic diagram of another embodiment of a power amplifier system 50. The power amplifier system 50 includes a power amplifier 60 and a power management system 61.

The power amplifier 60 includes a driver stage bipolar transistor 51, an output stage bipolar transistor 52, an input matching circuit 53, an interstage matching circuit 54, an output matching circuit 55, a driver stage inductor or choke 57, and an output stage inductor or choke 58.

As shown in FIG. 4A, the power amplifier 60 receives an RF input signal RF_IN, which is amplified using the driver stage bipolar transistor 51. A collector of the driver stage bipolar transistor 51 generates an amplified RF signal, which is provided to a base of the output stage bipolar transistor 52. The output stage bipolar transistor 52 further amplifies the amplified RF signal to generate the RF output signal RF_OUT. As shown in FIG. 4A, the emitters of the driver stage bipolar transistor 51 and output stage bipolar transistor 52 are electrically connected to a first voltage $V_1$, which can be, for example, a ground voltage.

As will be appreciated by persons having ordinary skill in the art, the input matching circuit 53, the interstage matching circuit 54, and the output matching circuit 55 provide impedance matching, thereby enhancing RF performance.

As shown in FIG. 4A, the power amplifier 60 receives a first bias signal BIAS1 for biasing a base of the driver stage bipolar transistor 51, and a second bias signal BIAS2 for biasing a base of the output stage bipolar transistor 52. The first and second bias signals BIAS1, BIAS2 can be generated by a power amplifier bias circuit, such as the power amplifier bias circuit 31 of FIG. 3.

The power amplifier 60 of FIG. 4A is powered using a first power amplifier supply voltage $V_{CC1}$ and a second power amplifier supply voltage $V_{CC2}$. The driver stage supply inductor 57 is electrically connected between the first power amplifier supply voltage $V_{CC1}$ and the collector of the driver stage bipolar transistor 51, and the output stage supply inductor 58 is electrically connected between the second power amplifier supply voltage $V_{CC2}$ and the collector of the output stage bipolar transistor 52. The driver stage supply inductor 57 and the output stage supply inductor 58 can aid in powering the power amplifier 60, while providing impedance sufficient to block RF signals generated by the power amplifier 60 from reaching the first and second power high supply voltages $V_{CC1}$, $V_{CC2}$.

Although the illustrated power amplifier 60 includes two stages, other configurations are possible, including, for example, power amplifiers including three or more stages. Although the illustrated power amplifier 60 is implemented using bipolar transistors, the teachings herein are also applicable to field-effect transistor configurations.

The power management system 61 includes an LDO regulator 62 and a DC-to-DC converter 63. As shown in FIG. 4A, the LDO regulator 62 receives a first power control signal CTL1 and generates the first power amplifier supply voltage $V_{CC1}$, which is used to power the driver stage bipolar transistor 51, in this embodiment. Additionally, the DC-to-DC converter 63 receives a second power control signal CTL2 and generates the second power amplifier supply voltage $V_{CC2}$, which is used to power the output stage bipolar transistor 52. In certain configurations, the first and second power controls signals CTL1, CTL2 are generated by a transceiver, such as the transceiver 33 of FIG. 3. Although the first and second power controls signals CTL1, CTL2 are illustrated as a separate control signals, in certain configurations, the LDO regulator 62 and the DC-to-DC converter 63 can be programmed over a common interface.

The illustrated power amplifier system 50 includes a multi-stage power amplifier 60 including a driver stage that is powered using the LDO regulator 62 and an output stage that is powered using a DC-to-DC converter 63. However, other configurations are possible, including, but not limited to, implementations in which the LDO regulator 62 provides power to a power amplifier stage other than a driver stage. The DC-to-DC converter 63 can operate using, for instance, average power tracking (APT) to achieve high efficiency for the power amplifier system. To provide a further enhancement to the power amplifier system's efficiency, the power amplifier 60 includes a driver stage that is powered using the LDO regulator 62. The LDO regulator 62 generates a programmable voltage that changes over time to increase the efficiency of the power amplifier system 50.

Although the DC-to-DC converter 63 can have a higher efficiency than the LDO regulator 62, the illustrated power amplifier system 50 can have a lower cost and/or size relative to a power amplifier system implemented using multiple DC-to-DC converters for generating the first and second power amplifier supply voltages $V_{CC1}$, $V_{CC2}$. Thus, the illustrated configuration advantageously provides an improvement in PAE by controlling the voltage level of the driver stage's power amplifier supply voltage, while avoiding the cost and/or size increase associated with using a DC-to-DC converter to generate the driver stage's power amplifier supply voltage. The illustrated configuration advantageously provides a performance improvement relative to a configuration using a fixed supply voltage to power the power amplifier's driver stage.

The LDO regulator 62 is implemented using an alternative discharge circuit as described herein. The alternative discharge circuit allows the LDO regulator to have a fast transient response when programming the first power amplifier supply voltage $V_{CC1}$ from a high voltage level to a low voltage level using the first power control signal CTL1. In contrast, a conventional LDO regulator has a transient response that is too slow to provide a programmable supply voltage for a power amplifier.

Accordingly, the illustrated power amplifier system 50 advantageously includes an LDO regulator for generating a power amplifier supply voltage for a driver stage of a power amplifier. Configuring the power amplifier system 50 in this manner achieves an increase in PAE while having a relatively small impact on cost and/or size of the power amplifier system 60.

Powering a driver stage of a power amplifier system using an LDO regulator can provide a number of advantages. For instance, a power amplifier system can include an output stage that is powered using a highly efficient switching regulator. Additionally, the LDO regulator can be programmed to control a voltage at the collector of a driver stage transistor to provide analog pre-distortion in conjunction with the switching regulator of the output stage. By providing analog pre-distortion using the LDO regulator, the output stage can operate with relatively low DC current, thereby pushing operation of the output stage to deeper AB class and achieving higher efficiency. The resulting gain expansion, which degrades linearity, can be compensated by the driver stage via the programmable LDO regulator. The analog pre-distortion achieved through the programming of the supply voltage of the driver stage can be used to provide a substantially flat AM-AM characteristic, which leads to efficient linear operation of the power amplifier over different power levels.

Figure 4B:
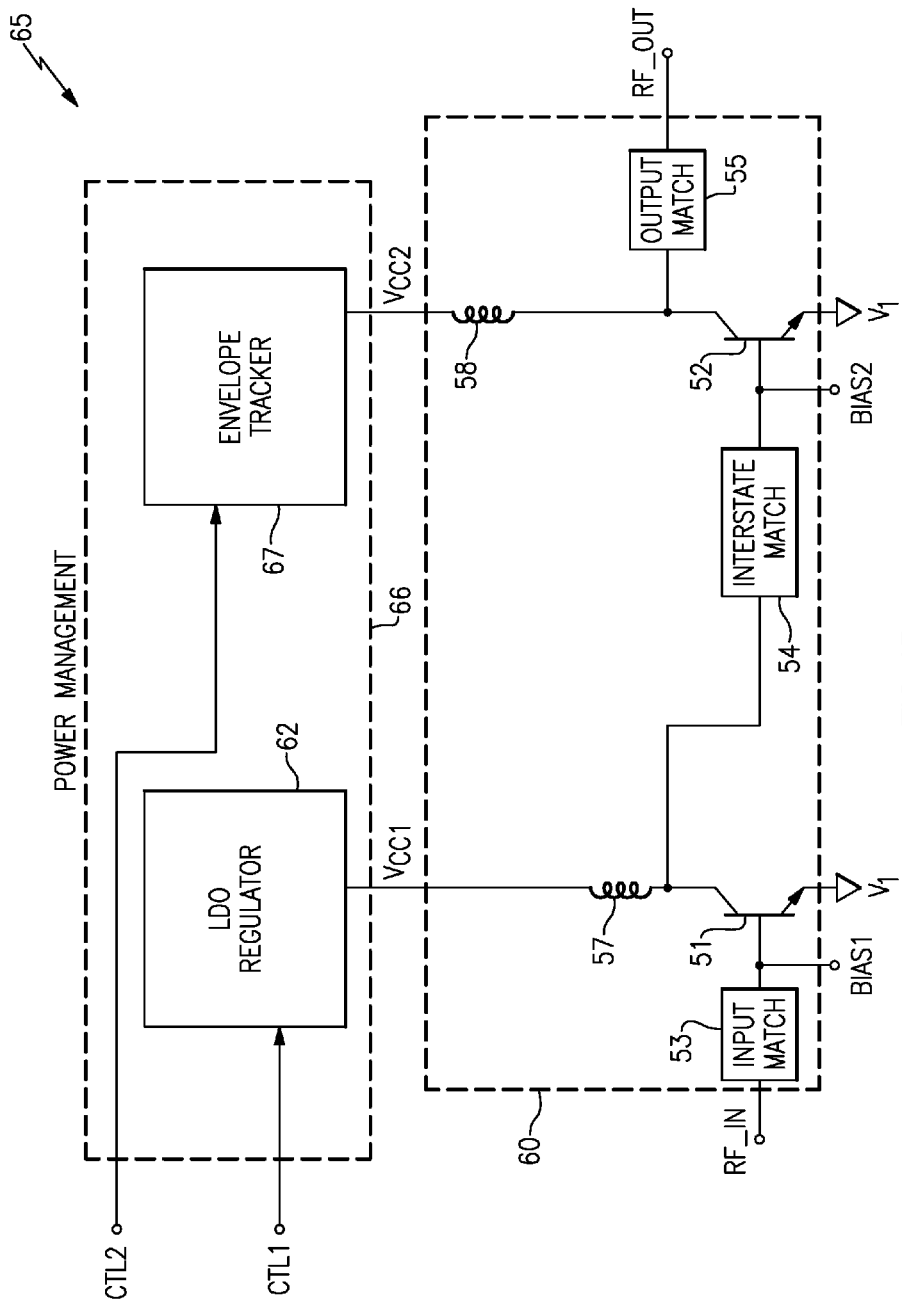
FIG. 4B is a schematic diagram of another embodiment of a power amplifier system.

FIG. 4B is a schematic diagram of another embodiment of a power amplifier system 65. The power amplifier system 65 includes a power amplifier 60 and a power management system 66.

The power amplifier system 65 of FIG. 4B is similar to the power amplifier system 50 of FIG. 4A, except that the power amplifier system 65 of FIG. 4B includes a different implementation of a power management system 66. In particular, the power management system 66 of FIG. 4B is similar to the power management system 61 of FIG. 6A, except that the power management system 66 omits the DC-to-DC converter 63 in favor of including an envelope tracker 67.

Additional details of the power amplifier system 65 can be as described earlier.

Figure 4C:
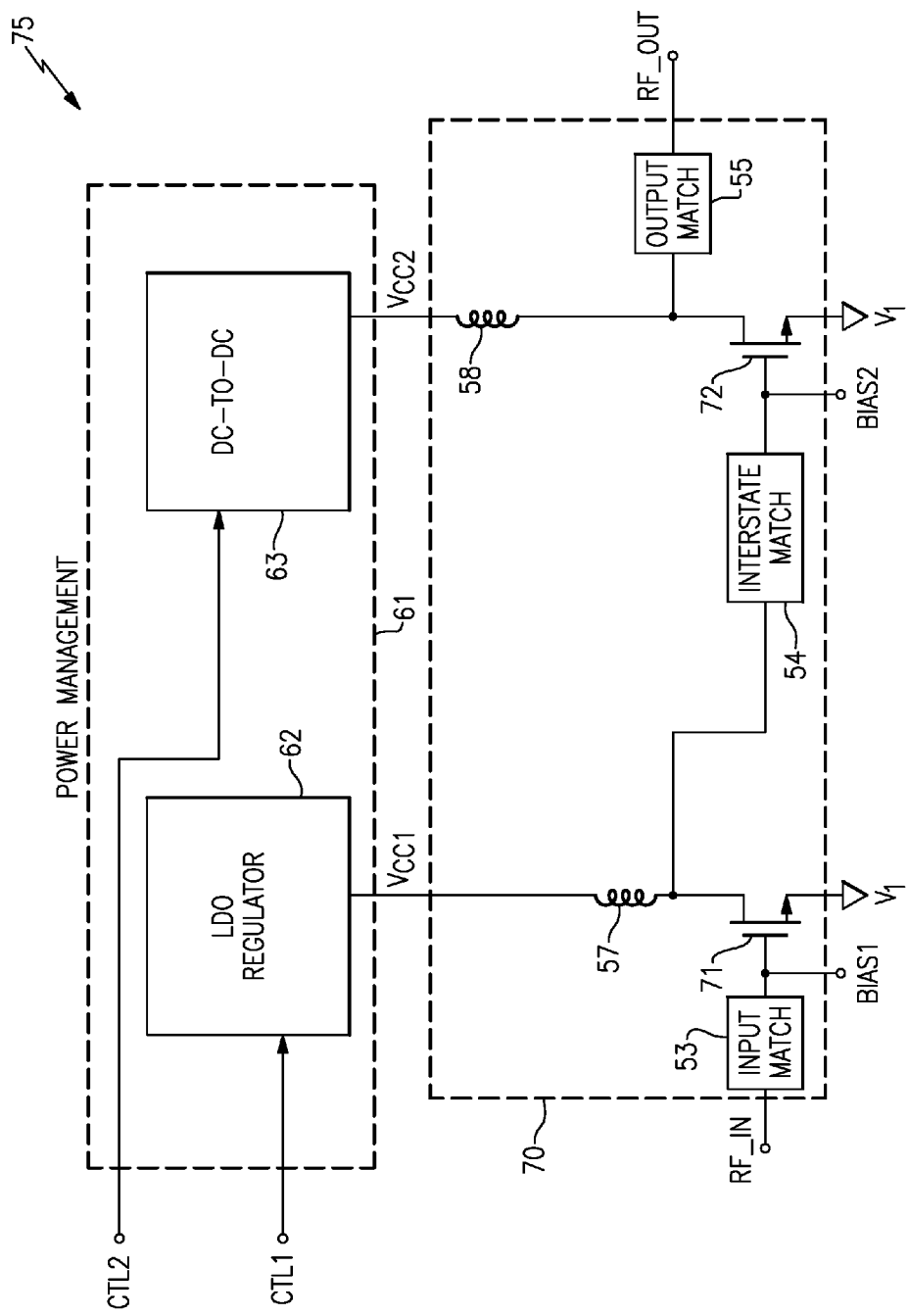
FIG. 4C is a schematic diagram of another embodiment of a power amplifier system.

FIG. 4C is a schematic diagram of another embodiment of a power amplifier system 75. The power amplifier system 75 includes a power amplifier 70 and a power management system 61.

The power amplifier system 75 of FIG. 4C is similar to the power amplifier system 50 of FIG. 4A, except that the power amplifier system 75 of FIG. 4C includes a different implementation of a power amplifier 70. In particular, the power amplifier 70 of FIG. 4C is similar to the power amplifier 60 of FIG. 6A, except that the power amplifier 70 omits the driver stage bipolar transistor 51 and the output stage bipolar transistor 52 in favor of including a driver stage FET 71 and an output stage FET 72, respectively.

Additional details of the power amplifier system 75 can be as described earlier.

Although FIGS. 4A-4C illustrated specific embodiments of power amplifier systems, the teachings herein are applicable to a wide variety of power amplifier systems, including, but not limited to, power amplifier systems including different implementations of power management systems and/or different implementations of power amplifiers. Moreover, the teachings herein are applicable not only to LDO regulators used to provide power to power amplifiers, but also to LDO regulators used to provide power to other types of electronic circuitry.

Figure 5A:
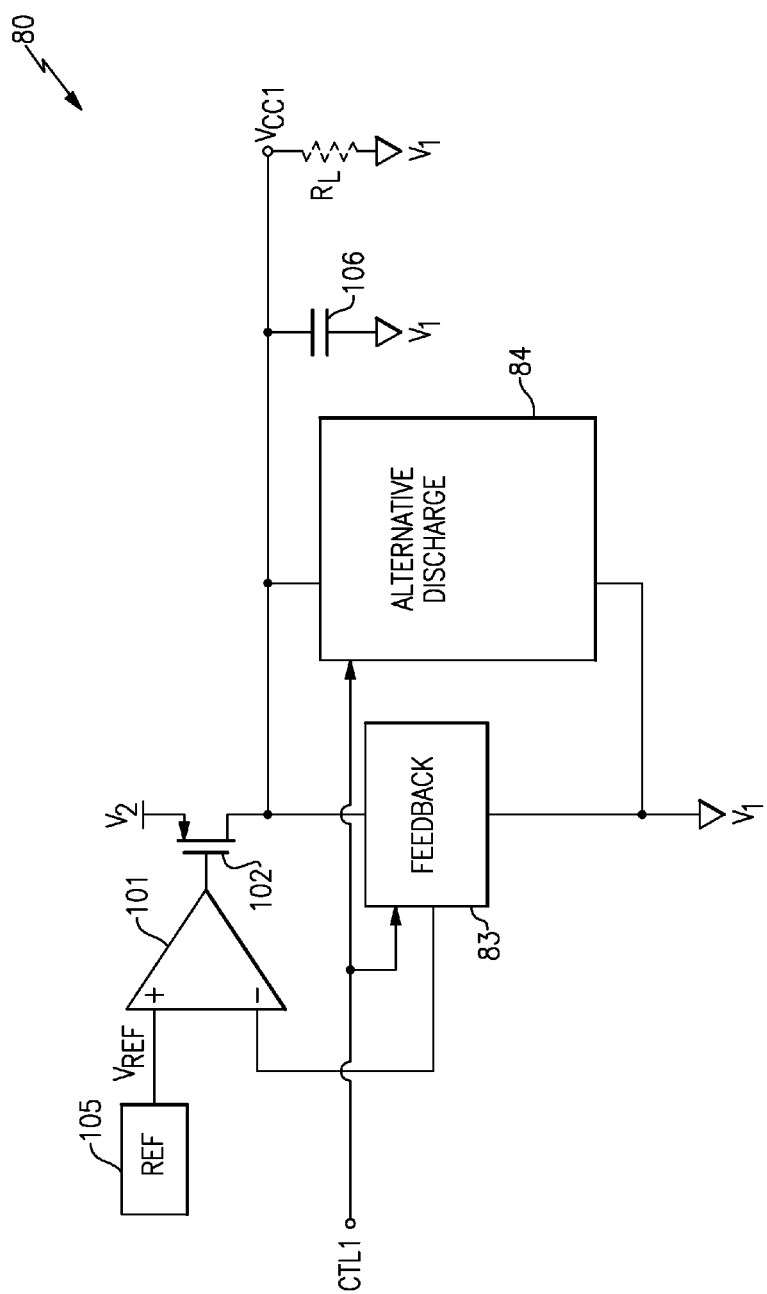
FIG. 5A is a schematic diagram of one embodiment of a low dropout (LDO) regulator.

FIG. 5A is a schematic diagram of one embodiment of an LDO regulator 80. The LDO regulator 80 includes an error amplifier 101, a regulation FET 102, a feedback circuit 83, an alternative discharge circuit 84, a reference voltage generator 105, and an output capacitor 106. The LDO regulator 80 has an output that provides an output voltage $V_{CC1}$. An LDO regulator's output is also referred to herein as an output node. The voltage level of the output voltage $V_{CC1}$ provided at the output node is programmable by a control signal CTL1.

The reference voltage generator 105 generates a reference voltage $V_{REF}$, which is provided to a non-inverting input of the error amplifier 101, in this embodiment. The regulation FET 102 includes a source electrically connected to a second voltage $V_2$, which can be instance, a power high supply voltage, such as a battery voltage. The regulation FET 102 further includes a gate electrically connected to an output of the error amplifier 101 and a drain electrically connected to the LDO regulator's output. The feedback circuit 83 is electrically connected between the LDO regulator's output and a first voltage $V_1$, and provides a feedback signal to an inverting input of the error amplifier 101. The output capacitor 106 is electrically connected between the output of the LDO regulator 80 and the first voltage $V_1$. Additionally, the alternative discharge circuit 84 is electrically connected between the output of the LDO regulator 80 and the first voltage $V_1$.

Although the LDO regulator 80 of FIG. 5A illustrates one example of an LDO regulator that includes an alternative discharge circuit, the teachings herein are applicable to LDO regulators implemented in a wide variety of ways.

In the illustrated configuration, the LDO regulator 80 is programmed by controlling a resistance of the feedback circuit 83 using the control signal CTL1. However, other configurations are possible. For example, an LDO regulator can be programmed in a variety of ways, such as by adjusting a resistance of a feedback resistor and/or a voltage of a reference voltage to an error amplifier. As shown in FIG. 5A, the control signal CTL1 is also provided to the alternative discharge circuit 84, which can aid the alternative discharge circuit 84 in determining the LDO regulator's target voltage, or steady-state voltage during regulation.

A transient response of the LDO regulator 80 can depend on slewing rate, bandwidth, and a capacitance of the output capacitor 106.

When the output voltage $V_{CC1}$ is programmed from a low voltage to a high voltage, the regulation FET 102 can be used to charge the output capacitor 106. Thus, LDO regulator 80 can achieve relatively fast transient response for low voltage to high voltage transitions of the output voltage $V_{CC1}$ by implementing the regulation FET 102 to be sufficiently wide to charge the output capacitor 106 in accordance with timing specifications.

However, when the output voltage $V_{CC1}$ is programmed from a high voltage to a low voltage, the regulation FET 102 can be turned off. Absent inclusion of the alternative discharge circuit 84, a transient response for high voltage to low voltage transitions of the output voltage $V_{CC1}$ can be based on an RC time constant associated with a resistance of the feedback circuit 83 and a capacitance of the output capacitor 106.

Such an RC time constant may be unsuitable for applications in which the output voltage $V_{CC1}$ is used to power RF electronics. For instance, to achieve stability in the presence of variations in loading (represented schematically by a resistor $R_L$), the output capacitor 106 can have a relatively large capacitance value. Additionally, to achieve low quiescent current, the feedback circuit 83 can have a relatively large resistance to reduce leakage current from the second voltage $V_2$ to the first voltage $V_1$ through the regulation FET 102 and the feedback circuit 83. Thus, the RC time constant associated with the resistance of the feedback circuit 83 and the capacitance of the output capacitor 106 can be relatively large. In such a configuration, the LDO regulator may have an RC time constant of 50 µs or more, which may be insufficient to meet a settling time specification in mobile applications.

The illustrated LDO regulator 80 includes the alternative discharge circuit 84, which activates to discharge the output capacitor 106 when the output voltage $V_{CC1}$ is programmed from a high voltage to a low voltage.

In certain configurations, the alternative discharge circuit 84 includes a detection circuit that compares the output voltage $V_{CC1}$ to a target voltage that is generated based on the control signal CTL1. Based on comparing the output voltage $V_{CC1}$ and the target voltage, the detection circuit can selectively activate an electrical path through the alternative discharge circuit 84 from the LDO regulator's output to the first voltage $V_1$ to discharge the output capacitor 106. In certain configurations, the electrical path through the alternative discharge circuit 84 is activated when the voltage difference between the output voltage $V_{CC1}$ and the target voltage is greater than a threshold or margin voltage, and is deactivated when the voltage difference between the output voltage $V_{CC1}$ and the target voltage is less than the threshold voltage.

Thus the alternative discharge circuit 84 can be used to discharge the output capacitor 106 when the output voltage $V_{CC1}$ is relatively high and far from the target voltage. However, when the output voltage $V_{CC1}$ and the target voltage are relatively close to one another, the electrical path through the alternative discharge circuit 84 can be deactivated. Configuring the LDO regulator 80 in this manner can aid in preventing the alternative discharge circuit 84 from generating overshoot, undershoot and/or glitch in the output voltage $V_{CC1}$.

Additional details for the LDO regulator 80 can be as described earlier.

Figure 5B:
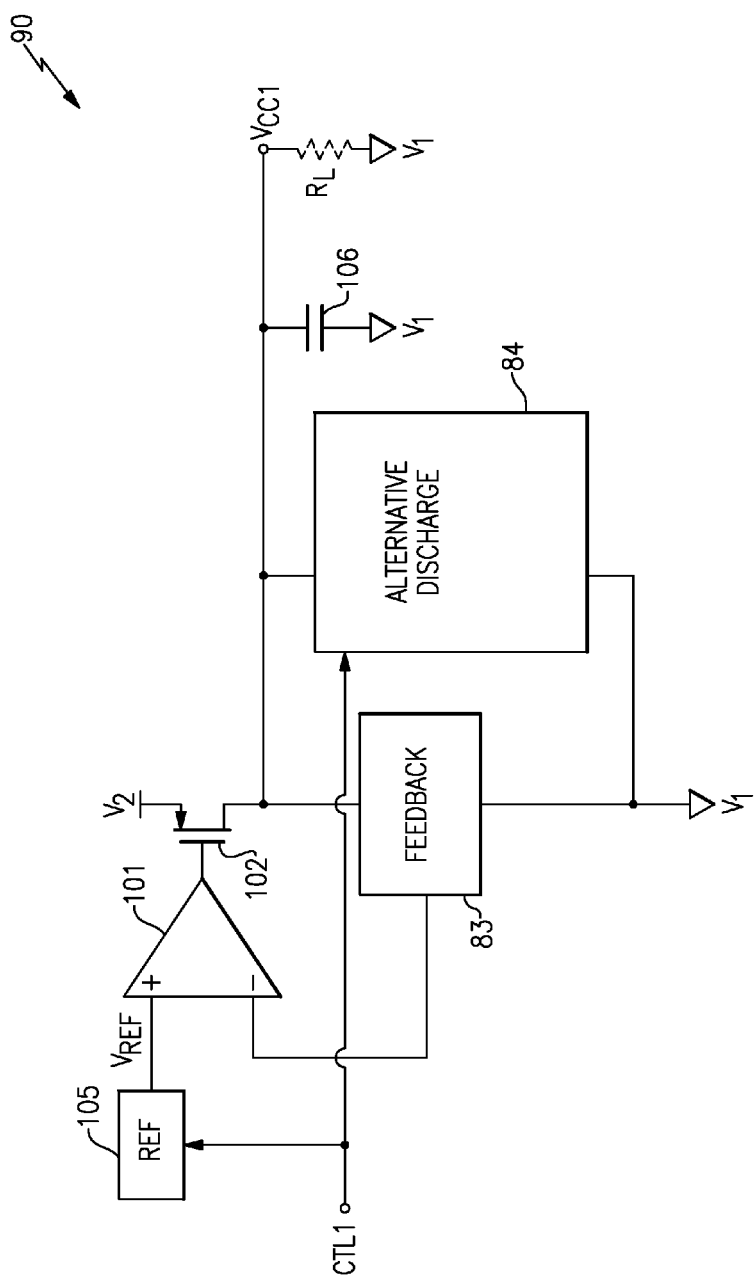
FIG. 5B is a schematic diagram of another embodiment of an LDO regulator.

FIG. 5B is a schematic diagram of another embodiment of an LDO regulator 90. The LDO regulator 90 of FIG. 5B is similar to the LDO regulator 80 of FIG. 5A, except that the LDO regulator 90 of FIG. 5B includes a different configuration of output voltage programming.

In particular, the illustrated LDO regulator 90 includes a reference voltage generator 105 that controls the voltage level of the reference voltage $V_{REF}$ based on the control signal CTL1. The voltage level of the reference voltage $V_{REF}$ can be controlled to achieve a desired output voltage $V_{CC1}$, since the error amplifier 101 is connected with negative feedback that operates to control the voltage levels of the error amplifier's non-inverting and inverting inputs to be about equal to one another.

Additional details of the LDO regulator 90 can be as described earlier.

Figure 6:
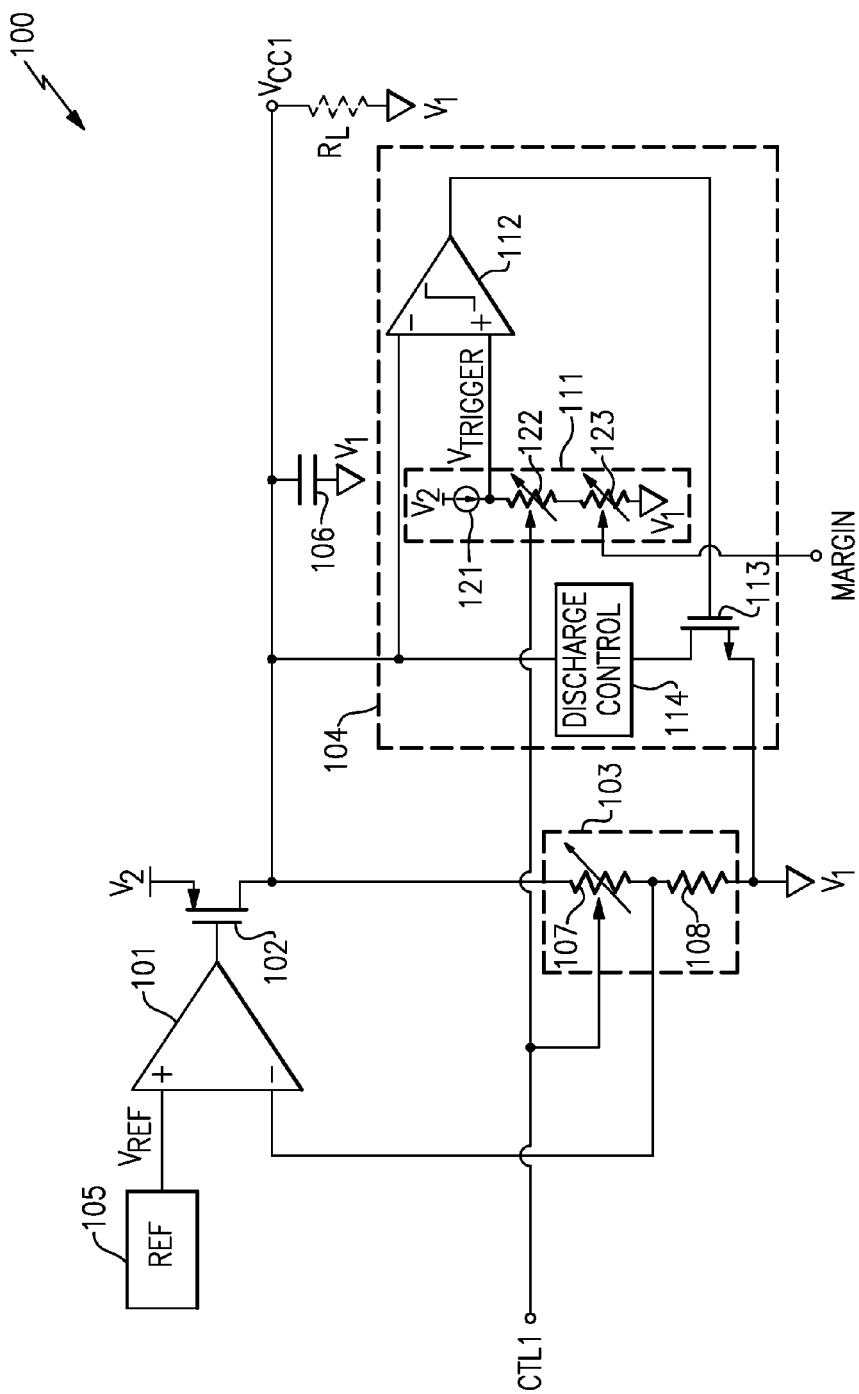
FIG. 6 is a schematic diagram of another embodiment of an LDO regulator.

FIG. 6 is a schematic diagram of another embodiment of an LDO regulator 100. The LDO regulator 100 includes a reference voltage generator 101, a regulation FET 102, and an output capacitor 106, which can be as described earlier. The LDO regulator 100 further includes a feedback network 103 and an alternative discharge circuit 104. The LDO regulator 100 of FIG. 6 illustrates one implementation of the LDO regulator 80 of FIG. 5A. However, the LDO regulator 80 of FIG. 5A can be implemented in other ways.

The feedback circuit 103 includes a first resistor 107 and a second resistor 108, which are electrically connected in series between the output of the LDO regulator 100 and the first voltage $V_1$. The first and second resistors 107, 108 operate as a voltage divider, and an intermediate node between the first and second resistors 107, 108 is used to provide a feedback signal to the inverting input of the error amplifier 101. In the illustrated configuration, the first resistor 107 is programmable based on the control signal CTL1. By changing the resistance of the first resistor 107, a ratio of the resistances of the first and second resistors 107, 108 can be controlled to achieve a desired output voltage $V_{CC1}$. Although one implementation of a feedback circuit has been shown in FIG. 6, a feedback circuit for an LDO regulator can be implemented in other ways.

The illustrated alternative discharge circuit 104 includes a trigger voltage generation circuit 111, a comparator 112, a discharge FET 113, and a discharge control circuit 114.

The trigger voltage generation circuit 111 generates a trigger voltage $V_{TRIGGER}$ for a first input of the comparator 112. The comparator 112 compares the trigger voltage $V_{TRIGGER}$ to the output voltage $V_{CC1}$ received at a second input. The trigger voltage generation circuit 111 includes a replica resistor 122, which is a replica of the first resistor 107 of the feedback circuit 103. As shown in FIG. 6, the replica resistor 122 is a programmable resistor controlled using the first control signal CTL1, and has a resistance that changes with the resistance of the first resistor 107. The trigger voltage generation circuit 111 further includes a current source 121, which is configured to generate a current that passes through the replica resistor 122. A voltage drop of the replica resistor 122 changes in relation to the LDO regulator's target voltage.

The illustrated trigger voltage generation circuit 111 further includes a margin resistor 123, which is programmable using a margin signal MARGIN in this embodiment. The current generated by current source 121 also flows through the margin resistor 123 to generate a margin voltage. The trigger voltage generation circuit 111 outputs a trigger voltage $V_{TRIGGER}$ corresponding to a sum of a target voltage of the LDO regulator across the replica resistor 122 and a margin voltage across the margin resistor 123. The resistance of the margin resistor 123 can be programmed to control timing of when a discharge path through the alternative discharge circuit 104 is active.

The comparator 112 compares the trigger voltage $V_{TRIGGER}$ generated by the trigger voltage generation circuit 111 to the output voltage $V_{CC1}$ of the LDO regulator 100. In the illustrated embodiment, when the output voltage $V_{CC1}$ is greater than the trigger voltage $V_{TRIGGER}$, the comparator 112 turns on the discharge FET 113 to provide a low impedance discharge path from the output of the LDO regulator 100 to the first voltage $V_1$. However, when the output voltage $V_{CC1}$ is less than the trigger voltage $V_{TRIGGER}$, the comparator 112 turns off the discharge FET 113, and the output voltage $V_{CC1}$ is controlled based on regulation operations of the LDO regulator 100.

The resistance of the margin resistor 123 can be increased or decreased to control the voltage level of the trigger voltage $V_{TRIGGER}$. Since the trigger voltage $V_{TRIGGER}$ determines when the electrical path through the alternative discharge circuit 104 is deactivated, the resistance of the margin resistor 123 controls timing of a hand-off of control of the output voltage $V_{CC1}$ from the alternative discharge circuit 104 to the LDO regulator's regulation loop. The margin resistor 123 can be programmed with a resistance sufficient to prevent the alternative discharge circuit 104 from generating overshoot, undershoot and/or glitch in the output voltage $V_{CC1}$. The margin resistor 123 can also be programmed to compensate for manufacturing and/or temperature variations.

The illustrated alternative discharge circuit 104 further includes the discharge control circuit 114, which can be used to limit a maximum amount of current that the alternative discharge circuit 104 can discharge from the output capacitor 106. In one embodiment, the discharge control circuit 114 includes a resistor that is in series with the discharge FET 113. In one embodiment, the resistor is about 10Ω. Including the discharge control circuit 114 can help reduce ringing in the output voltage $V_{CC1}$. Furthermore, when the comparator 112 turns off the discharge FET 113, the discharge control circuit 114 can inhibit charge present in the channel of the discharge FET 113 from flowing back into the output capacitor 106. Thus, inclusion of the discharge control circuit 114 can enhance transient performance of the LDO regulator 100.

Additional details of the LDO regulator 100 can be similar to those described earlier.

Figure 7A:
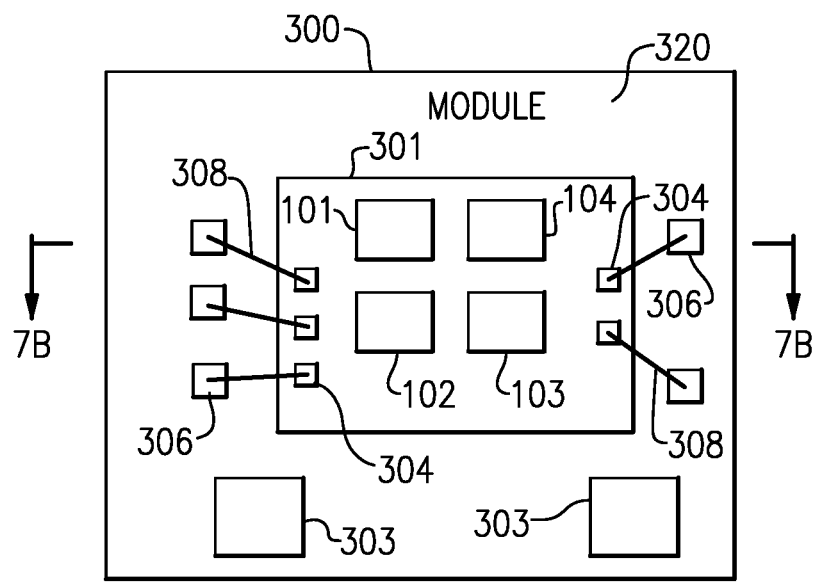
FIG. 7A is a schematic diagram of one embodiment of a packaged module.
Figure 7B:
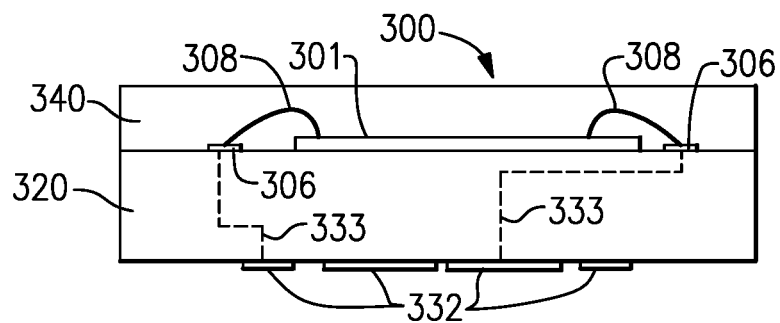
FIG. 7B is a schematic diagram of a cross-section of the packaged module of FIG. 7A taken along the lines 7B-7B.

FIG. 7A is a schematic diagram of one embodiment of a packaged module 300. FIG. 7B is a schematic diagram of a cross-section of the packaged module 300 of FIG. 7A taken along the lines 7B-7B.

The packaged module 300 includes an IC or die 301, surface mount components 303, wirebonds 308, a package substrate 320, and encapsulation structure 340. The package substrate 320 includes pads 306 formed from conductors disposed therein. Additionally, the die 301 includes pads 304, and the wirebonds 308 have been used to electrically connect the pads 304 of the die 301 to the pads 306 of the package substrate 301.

As illustrated in FIGS. 7A and 7B, the die 301 includes an error amplifier 101, a regulation FET 102, a feedback circuit 103, and an alternative discharge circuit 104, which can be as described earlier. In one embodiment, the die 301 further includes a voltage generator 105.

The packaging substrate 320 can be configured to receive a plurality of components such as the die 301 and the surface mount components 303, which can include, for example, surface mount capacitors and/or inductors. In one embodiment, the surface mount components 303 include an output capacitor 106.

As shown in FIG. 7B, the packaged module 300 is shown to include a plurality of contact pads 332 disposed on the side of the packaged module 300 opposite the side used to mount the die 301. Configuring the packaged module 300 in this manner can aid in connecting the packaged module 300 to a circuit board such as a phone board of a wireless device. The example contact pads 332 can be configured to provide RF signals, bias signals, power low voltage(s) and/or power high voltage(s) to the die 301 and/or the surface mount components 303. As shown in FIG. 7B, the electrically connections between the contact pads 332 and the die 301 can be facilitated by connections 333 through the package substrate 320. The connections 333 can represent electrical paths formed through the package substrate 320, such as connections associated with vias and conductors of a multilayer laminated package substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Figure 8A:
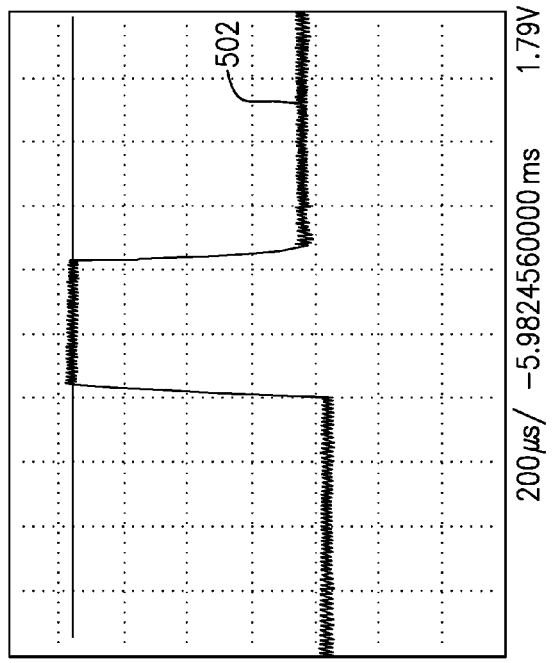
FIG. 8A is a graph of one example of laboratory data of output voltage versus time for an LDO regulator.

FIG. 8A is a graph of one example of laboratory data of output voltage versus time for an LDO regulator. The graph includes a first plot 501 of voltage versus time for a high voltage to low voltage transition of an LDO regulator implemented without an alternative discharge circuit. The graph of FIG. 8A also includes a table of measurement data associated with the laboratory data. As shown in FIG. 8A, the LDO regulator can exhibit a relatively slow transient response for the high voltage to low voltage transition. In particular, a fall time of the LDO regulator associated with changing the programmable output voltage of the LDO regulator from a high voltage level to a low voltage level can be relatively poor.

Figure 8B:
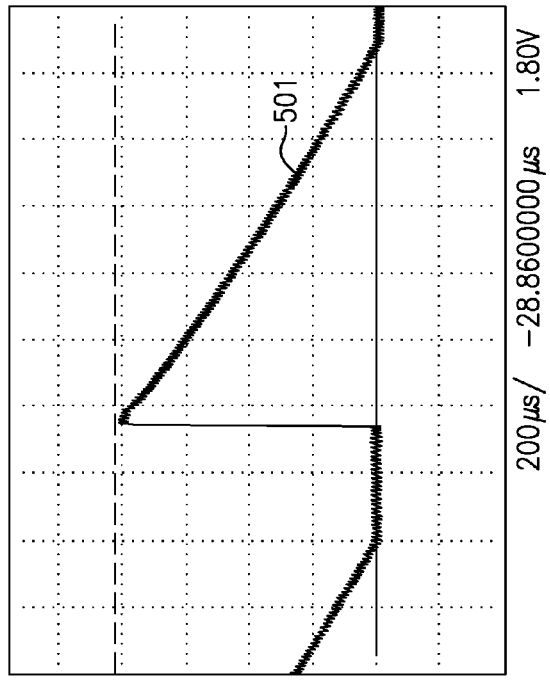
FIG. 8B is a graph of another example of laboratory data of output voltage versus time for an LDO regulator.

FIG. 8B is a graph of another example of laboratory data of output voltage versus time for an LDO regulator. The graph includes a second plot 502 of voltage versus time for a high voltage to low voltage transition of an LDO regulator implemented with an alternative discharge circuit. The graph of FIG. 8B also includes a table of measurement data associated with the laboratory data. As shown in FIG. 8B, the LDO regulator can exhibit a relatively fast transient response. Although one example of laboratory data is shown, results can differ based on a wide variety of factors, including, for example, application and/or implementation.

Applications

Some of the embodiments described above have provided examples in connection with wireless devices or mobile phones. However, the principles and advantages of the embodiments can be used for any other systems or apparatus that have needs for LDO regulators.

Such LDO regulators can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A programmable low dropout regulator comprising:
an error amplifier including an output and a first input;
a regulation field-effect transistor including a gate electrically connected to the output of the error amplifier and a drain electrically connected to an output node configured to provide a programmable output voltage that is programmable to a plurality of different voltage levels;
a feedback circuit electrically connected between the output node and a first voltage, the feedback circuit configured to provide a feedback signal to the first input of the error amplifier;
an output capacitor electrically connected to the output node; and
an alternative discharge circuit configured to activate to discharge the output capacitor in response to programming the programmable output voltage from a high voltage level to a low voltage level.

2. The programmable low dropout regulator of claim 1 wherein the alternative discharge circuit includes a comparator configured to compare the programmable output voltage to a trigger voltage, and to selectively activate an electrical path from the output node to the first voltage based on the comparison.

3. The programmable low dropout regulator of claim 2 wherein the alternative discharge circuit further includes a discharge field-effect transistor including a source electrically connected to the first voltage and a gate electrically connected to an output of the comparator.

4. The programmable low dropout regulator of claim 3 wherein the alternative discharge circuit further includes a discharge control circuit electrically connected between the output node and the drain of the regulation field-effect transistor.

5. The programmable low dropout regulator of claim 2 wherein the alternative discharge circuit further includes a trigger voltage generation circuit configured to generate the trigger voltage, the trigger voltage generation circuit including one or more resistors and a current source that provides a current that flows through the one or more resistors to generate the trigger voltage.

6. The programmable low dropout regulator of claim 2 wherein the low dropout regulator is configured to receive a control signal operable to control a programmed voltage level of the programmable output voltage, the alternative discharge circuit configured to adjust a voltage level of the trigger voltage based on the control signal.

7. The programmable low dropout regulator of claim 1 wherein the feedback circuit includes a first resistor and a second resistor electrically connected in series between the output node and the first voltage, the first resistor having a programmable resistance operable to change a programmed voltage level of the programmable output voltage.

8. The programmable low dropout regulator of claim 1 further including a reference voltage generator configured to provide a reference voltage to a second input of the error amplifier.

9. A power amplifier system comprising:
a multi-stage power amplifier including a driver stage; and
a programmable low dropout regulator including an output that powers the driver stage with a programmable output voltage that is programmable to a plurality of different voltage levels, the programmable low dropout regulator including an error amplifier, a regulation field-effect transistor including a gate electrically connected to an output of the error amplifier and a drain electrically connected to the output of the programmable low dropout regulator, a feedback circuit configured to provide feedback to a first input of the error amplifier based on a voltage level of the programmable output voltage, an output capacitor electrically connected to the output of the programmable low dropout regulator, and an alternative discharge circuit configured to activate to discharge the output capacitor in response to programming the programmable output voltage from a high voltage level to a low voltage level.

10. The power amplifier system of claim 9 further comprising a transceiver configured to generate a control signal operable to control the voltage level of the programmable output voltage.

11. The power amplifier system of claim 10 wherein the programmable low dropout regulator further includes a reference voltage generator configured to generate a reference voltage for a second input of the error amplifier, the reference voltage generator configured to receive the control signal.

12. The power amplifier system of claim 10 wherein the feedback circuit includes a resistor having a programmable resistance controlled by the control signal.

13. The power amplifier system of claim 9 wherein the alternative discharge circuit includes a comparator configured to compare the programmable output voltage to a trigger voltage, and to selectively activate an electrical path from the output of the programmable low dropout regulator to a first voltage based on the comparison.

14. The power amplifier system of claim 13 wherein the electrical path includes a discharge control circuit and a discharge field-effect transistor electrically connected in series between the output of the programmable low dropout regulator and the first voltage.

15. The power amplifier system of claim 9 wherein the multi-stage power amplifier further includes an output stage, the power amplifier system further including a DC-to-DC converter that powers the output stage.

16. The power amplifier system of claim 9 wherein the multi-stage power amplifier further includes an output stage, the power amplifier system further including an envelope tracker that powers the output stage.

17. A method of voltage regulation in a programmable low dropout regulator, the method comprising:

controlling a gate of a regulation field-effect transistor using an error amplifier;

regulating an output voltage provided at an output node using the regulation field-effect transistor;

generating a feedback signal for a first input of the error amplifier based on a voltage level of the output voltage using a feedback circuit;

stabilizing the output voltage using an output capacitor;

programming the output voltage from a high voltage level to a low voltage level; and activating an alternative discharge circuit to discharge the output capacitor in response to programming the output voltage from the high voltage level to the low voltage level.

18. The method of claim 17 further comprising powering a driver stage of a power amplifier using the output voltage.

19. The method of claim 17 further comprising comparing the programmable output voltage of the low dropout regulator to a trigger voltage using a comparator, and selectively activating an electrical path from the output node to a first voltage through the alternative discharge circuit based on the comparison.

20. The method of claim 19 further comprising programming the voltage level of the output voltage using a control signal, and adjusting a voltage level of the trigger voltage based on the control signal.

21. The programmable low dropout regulator of claim 1 wherein the alternative discharge circuit is configured to selectively activate an electrical path from the output node to the first voltage to discharge the capacitor.

* * * * *